United States Patent [19]
Yada

[11] Patent Number: 5,576,638
[45] Date of Patent: Nov. 19, 1996

[54] LEVEL SHIFT CIRCUIT WITH DC COMPONENT EXTRACTION AND CONTROLLED CURRENT MIRRORS

[75] Inventor: Toshiro Yada, Kanagawa, Japan

[73] Assignee: Mitsubishi Denki Kabushiki Kaisha, Tokyo, Japan

[21] Appl. No.: 490,615

[22] Filed: Jun. 15, 1995

[30]     Foreign Application Priority Data

Dec. 27, 1994   [JP]   Japan ..................... 6-325303

[51] Int. Cl.$^6$ ............................................. H03K 19/0175
[52] U.S. Cl. .................................. 326/62; 326/63
[58] Field of Search ................... 326/76, 63, 62

[56]             References Cited

U.S. PATENT DOCUMENTS

| | | | |
|---|---|---|---|
| 4,492,882 | 1/1985 | Jensen et al. | 326/62 |
| 4,703,199 | 10/1987 | Ely | 326/63 |
| 4,972,517 | 11/1990 | Kondou et al. | 326/62 |
| 5,047,657 | 9/1991 | Seevinck et al. | 326/62 |
| 5,097,144 | 3/1992 | Chang et al. | 326/62 |

*Primary Examiner*—Edward P. Westin
*Assistant Examiner*—Richard Roseen
*Attorney, Agent, or Firm*—Oblon, Spivak, McClelland, Maier & Neustadt, P.C.

[57]               ABSTRACT

A level shift circuit is provided which maintains DC level of output signals constant by controlling the level variation of the output signals according to DC level variation of the input signal. An input signal is applied to a first circuit comprised of a first buffer, a first resistor and a first constant current source. DC component extracted from the input signal is applied to a second circuit comprised of a second buffer, a second resistor and a second constant current source. A reference voltage and a voltage obtained by subtracting a voltage drop of the second resistor from DC component are applied to an operational amplifier, respectively. An resultant output of the operational amplifier controls the first and the second constant current resources, and then corrects a variation of DC component of the input signal to obtain an output signal having a constant shift level.

27 Claims, 11 Drawing Sheets

5,576,638

1

LEVEL SHIFT CIRCUIT WITH DC COMPONENT EXTRACTION AND CONTROLLED CURRENT MIRRORS

BACKGROUND OF THE INVENTION

1. Field of the Invention

The invention relates to a level shift circuit which supplies constant DC output level at all time by correcting the level shift quantity of an output signal according to a drift of DC component of an input signal.

2. Description of the Prior Art

In the semiconductor integrated circuit, DC level of the necessary input signal varies depending on its kind. When DC level of the input signal deviates from the input DC level necessary for the circuit, a waveform of output signal is distorted. Therefore, an input DC level should be maintained constant. A factor which causes DC level variation depends on element characteristics of transistor ($h_{fe}$ and $v_{be}$) and resistor used in the semiconductor integrated circuit. The factor varies depending on temperature and conditions during manufacturing. Accordingly, circuits constituted of these elements will have characteristics which vary by the temperature change and manufacturing conditions. DC level of the input signal also varies when passing through such circuits.

Therefore, when inputting a signal into a certain circuit in a semiconductor integrated circuit, DC level of input signal needs to be matched with an input DC level of the circuit. For this reason, a level shift circuit is almost always used when connecting a single circuit with other circuit. When a signal is inputted into the level shift circuit, its amplitude remains the same while its DC voltage varies. There is a kind of level shift circuit which uses capacitive coupling or voltage drop of the resistor. The level shift circuit using a capacitive coupling circuit is unsuitable for semiconductor integrated circuit since it needs to increase the capacity value or ohmic value of a capacitor used for capacitive coupling when the frequency of handled signal is low. From this reason, diodes are generally used in the level shift circuit.

For the level shift circuit which shifts the input signal by a certain constant voltage and outputs it, conventional circuits shown in FIGS. 9, 10 and 11 are used.

FIG. 9 is a level shift circuit consisted of transistor $Q_{21}$, resistor $R_{21}$, constant current source $I_{21}$. In FIG. 9, a signal inputted from the input terminal 21 is shifted by the sum of the base-emitter interval voltage ($V_{BE}$) of NPN transistor and the voltage drop ($R_{21} \times I_{21}$) of resistor $R_{21}$, and outputted from the output terminal 22.

FIG. 10 is a level shift circuit consisted of a transistor $Q_{22}$, a resistor $R_{22}$, a constant current source $I_{22}$ an outer terminal 23 which is connected with the outside circuit of integrated semiconductor circuit. In FIG. 10, current value of the constant current source $I_{22}$ is controlled through the outer terminal 23 by controlling the quantity of resistor voltage drop of $R_{24}$ from the outside. Thus, a desired level shift quantity is obtained in this level shift circuit.

FIG. 11 comprises a signal source 91, transistors $Q_{91}$ and $Q_{92}$ and resistors $R_{91}$ and $R_{92}$ which constitute a differential amplifier. FIG. 11 further comprises a constant current source 92, transistors $Q_{93}$ and $Q_{94}$ whose collectors are connected to a constant voltage source 97 and their bases are connected to collectors of transistors $Q_{92}$ and $Q_{91}$, respectively, diodes $D_{91}$, $D_{92}$ and $D_{93}$ connected in series to the emitter of transistor $Q_{93}$, diodes $D_{94}$, $D_{95}$ and $D_{96}$ connected in series connection to the emitter of transistor $Q_{94}$, an output terminal 98 connected to the cathode of diodes $D_{93}$, a constant current source 95 whose one end is contacted to the earth and the other end is connected to the cathode of diodes $D_{93}$. FIG. 11 further comprises an output terminal 99 connected to the cathode of diodes $D_{96}$, a constant current source 96 whose one end is connected to the earth and the other end is connected to the cathode of diodes $D_{96}$, resistors $R_{95}$ and $R_{96}$ whose respective one end is connected to the cathodes of diodes $D_{93}$ and $D_{96}$, respectively, and common junction ends are connected to non-inverted input terminal of error amplifier 94, which obtain in-phase output voltage in the level shift circuit, a reference voltage source 93 whose one end is connected to the constant voltage source 97 and the other end is connected to the inverted input terminal of the error amplifier 94. The output of the error amplifier 94 is connected to the base of transistor $Q_{95}$, the emitter of the transistor $Q_{95}$ is connected to the earth, resistors $R_{93}$ and $R_{94}$ whose respective one end is connected to the collectors of transistors $Q_{91}$ and $Q_{92}$, respectively, whose common ends are connected to the collector of transistor $Q_{95}$.

An operation of FIG. 11 is explained below. When resistors $R_{95}$ and $R_{96}$ are set to the same ohmic value, the voltage of $R_{95}$ and $R_{96}$ at common connecting point becomes the same as the in-phase output voltage of level shift circuit. Error amplifier 94 controls the in-phase output voltage to be the same as the inverted input terminal voltage. Assuming the ohmic value of resistors $R_{91}$ and $R_{92}$ to be R, the current value of constant current source 92 to be I, the collector current of transistor $Q_{95}$ to be i, the voltage of reference voltage source 93 to be V1, and the base-emitter interval voltage of transistors $Q_{93}$ and $Q_{94}$ and the forward voltage of diodes $D_{91}$, $D_{92}$, $D_{93}$, $D_{94}$, $D_{95}$ and $D_{96}$ to be equal to $V_{BE}$. By assuming the voltage of constant voltage source 97 as $V_{CC}$ and ignoring the base current of transistors $Q_{91}$, $Q_{92}$, $Q_{93}$ and $Q_{94}$, the in-phase output voltage $V_{OUT}$ of output terminal 98 and 99 becomes $$V_{OUT} = V_{CC} - (I+i)R/2 - 4V_{BE}$$
$$= V_{CC} - V_1$$

The level shift circuit having good temperature characteristics is realized by compensating temperature characteristics of the reference voltage source 93.

The relationship between the input and the output signals in FIG. 11 is explained below. The two inverted signals having the same DC components (shown by straight line) such as a signal A and a signal B in FIG. 12 (a) are outputted from the signal source 91. If the signal A is inputted into the base of $Q_{91}$ and the signal B into the base of $Q_{92}$, then, signals similar to the signal A and B are outputted from the output terminals 98 and 99. In other words, if the phase delay of input and output signals can be ignored, signals having the same phase as the signals A and B, respectively, and having the respective amplitude amplified by the predetermined gain are outputted from the output terminals 98 and 99. Since DC voltage of the output terminals 98 and 99 are equal and the value of resisters $R_{95}$ and $R_{96}$ are also equal, an averaged signal which is generated by averaging the output terminals 98 and 99 is inputted into the non-inverted input terminal of error amplifier 94. Since the polarity of the output terminals 98 and 99 are opposite, an average DC component of both output signals is extracted.

If the temperature varies here, since the forward voltage of diodes $D_{91}$~$D_{96}$ varies, each DC voltage of the output terminals 98 and 99 varies, and the non-inverted input voltage of error amplifier 94 varies too. As a result, the error amplifier 94 causes its output voltage and the collector current i of $Q_{95}$ to vary. The collector current causes the current which flows in the load resistors $R_{91}$ and $R_{92}$ through resistors $R_{93}$ and $R_{94}$ to vary. The error amplifier 94 finally causes the average DC voltage of the terminals 98 and 99 to be equal to $(V_{CC}-V_1)$. Where, $V_1$ is a reference voltage which is inputted into the inverted terminal of error amplifier 94. The DC voltage (in-phase output voltage) of the output terminals 98 and 99 is kept constant in this way.

In FIG. 9, since the quantity of the level shift is constant, if DC component of the input signal inputted into the terminal 21 varies, the level of terminal 22 shifts according to the level variation of the input signal. Therefore, it was impossible to get the constant DC output level.

In FIG. 10, it is necessary to provide an outer terminal 23 which controls the current value of the constant current source $I_{21}$ from the outside of IC. It is also necessary to supply a special wiring to the outer terminal in the integrated circuit. These are not desirable for an integrated circuit design. Furthermore, if DC component of the signal inputted into the input terminal 21 always varies, it is further necessary to supply another terminal and other wiring for detecting voltage variation of the input terminal 21 in the integrated circuit, which are also not desirable for a integrated circuit design.

A variation of DC level of the input signal in FIG. 11 is considered below. If each DC voltage of the two signals outputted from the signal source 91 varies in the same direction, there is no problem, because there appears no variation in DC voltage at the output terminals 98 and 99 by nature of differential amplifier. On the other hand, it is possible that each DC voltage of the two input signals deviates towards opposite directions as shown in FIG. 12 (b). In FIG. 12 (b), one of the two signals, DC level of the input signal A, rises such as a signal A' after a certain point, and another signal, DC level of the input signal B, falls by the same value such as signal B'. The signal B' is obtained by simply inverting the signal of signal A'. The output from the signal source 91 is thought to be such a pair signals. In this case, signals from the output terminals 98 and 99 vary towards the same direction as signals A' and B' and each DC voltage at the two output terminals becomes different. But, since the two signals of the output terminals keeps inverted relation, the average voltage of the both signals does not change. If there is a drift in the input signal level, the in-phase output voltage remains constant and DC voltage of the output terminal can not be kept constant because the variation of the DC voltage of the output terminal cannot be detected.

It is an object of the present invention is to solve the problems mentioned above. The present invention relates to a level shift circuit for keeping DC level of the output signal constant by controlling a shift quantity of the output signal in accordance with the drift of DC level of the input signal.

It is further object of the present invent to provide a level shift circuit in which DC component of the output signal remains the same without any regulation even if DC component of the input signal changes.

It is further object of the present invention is to provide a level shift circuit where DC component of the input voltage of the input terminal is extracted and the extracted voltage is compared with the reference voltage in the operational amplifier. Then, the output of the operational amplifier controls the current source one end of which is grounded to the earth in order to obtain a constant DC output voltage by compensating quantity of DC component of the input signal.

It is further object of the present invention to provide a level shift circuit where the current source connected to the power source is controlled by the output of the operational amplifier in order to obtain DC output voltage which has a higher shift level than the DC level of the input voltage.

It is further object of the present invention to provide a level shift circuit where the shift level difference between the input and output of the level shift circuit can be controlled to be smaller than the voltage $V_{BE}$ by causing the difference between the input level and output level of the buffer to be smaller than the voltage $V_{BE}$ between the emitter and the base of transistor.

It is further object of the present invention to provide a level shift circuit wherein DC component is easily extracted by using a low pass filter, a peak hold circuit or a sample hold circuit as DC component extraction circuit.

In order to solve the problems above, a first level shift circuit of the present invention comprises a first circuit comprising a first buffer, a first resistor and a first constant current source. The circuit further comprises a second circuit comprising a second buffer, a second resistor and a second constant current source. The circuit further comprises an operational amplifier having an inverted terminal and a non-inverted terminal. An input signal is applied to the first circuit, DC component extracted from the input signal is applied to the second circuit, voltage where voltage drop in the second resistor is subtracted from said DC component is applied to the inverted terminal of the operational amplifier, and reference voltage is applied to the non-inverted terminal of the operational amplifier. Then the first and the second constant current sources are controlled by an output of the operational amplifier, thereby a drift of DC component of the input signal is corrected and an output voltage having a constant shift level is obtained.

Further, in the first level shift circuit of the present invention, the level shift circuit comprises a DC component extraction circuit, a first and a second buffers, a first and a second resistors, a first and a second constant current sources and an operational amplifier. An input terminal is connected to one end of the first buffer, the other end of the first buffer is connected to one end of a first resistor, the other end of the first resister is connected to one end of a first constant current source, and the other end of the constant current source is connected to the earth.

An output terminal is connected to a junction of the other end of the first resistor and one end of the constant current source.

One end of DC component extraction circuit is connected to the input terminal and the other end of DC component extraction circuit is connected to one end of a second buffer, the other end of the second buffer is connected to one end of a second resistor, the other end of the second resistor is connected to one end of a second constant current source, the other end of this constant current source is connected to the earth, the other end of the second resistor is also connected to an inverted terminal of the operational amplifier.

A reference terminal from which a reference voltage is applied is connected to a non-inverted terminal of the operational amplifier, an output of the operational amplifier is connected to a control terminal which controls current values of the first and the second constant current sources. Thereby a drift of DC component of the input signal is corrected and an output voltage having a constant shift level is obtained.

In the second level shift circuit of the present invention, the level shift circuit comprises DC component extraction circuit, a first and a second buffers, a first and a second resistors, a first and a second constant current sources and an operational amplifier. An input terminal is connected to one end of the first buffer, the other end of the first buffer is connected to one end of a first resistor, the other end of the first resister is connected to one end of a first constant current source, the other end of the constant current source is connected to the power source. An output terminal is connected to a junction of the other end of the first resistor and one end of the constant current source, one end of DC component extraction circuit is connected to the input terminal and the other end of DC component extraction circuit is connected to one end of a second buffer, the other end of the second buffer is connected to one end of a second resistor, the other end of the second resistor is connected to one end of a second constant current source, the other end of this constant current source is connected to the power source, the other end of the second resistor is also connected to an inverted terminal of the operational amplifier. A reference terminal from which a reference voltage is applied is connected to a non-inverted terminal of the operational amplifier, an output of the operational amplifier is connected to a control terminal which controls current values of the first and the second constant current sources. Thereby a drift of DC component of the input signal is corrected and an output voltage having a constant shift level is obtained.

In the first level shift circuit of the present invention, the inputs of the first and the second buffer are connected to each base of respective transistors and outputs are connected to each emitter of respective transistors, the power source is connected to each collector of the respective transistors and the first and the second constant current sources constitutes a mirror circuit.

In the second level shift circuit of the present invention, the inputs of the first and the second buffer are connected to each base of respective transistors and outputs are connected to each emitter of respective transistors, the earth is connected to each collector of the respective transistors, and the first and the second constant current sources constitutes a mirror circuit.

In the first and the second level shift circuits of the present invention, the difference between the input level and output level of the first and the second buffers is smaller than the base-emitter interval voltage $V_{BE}$ of the transistor, and the first and the second constant current sources constitutes a mirror circuit.

In said the first or the second buffer circuit of the first and the second level shift circuits of the present invention, a collector of the transistor is connected to a power source and an emitter of the transistor is connected to one end of a constant current source, the other end of the constant current source is connected to earth, an output terminal of this buffer circuit is connected to a junction between the emitter of the transistor and the one end of the current source, said junction is also connected to an inverted terminal of an operational amplifier, an input terminal of this buffer circuit is connected to a non-inverted terminal of the operational amplifier and an output terminal of this operational amplifier is connected to a base of the transistor.

In the first level shift circuit of the present invention, said operational amplifier comprises first and second NPN transistors and third and fourth PNP transistors, a base of the first NPN transistor defines a non-inverted terminal of the operational amplifier, a base of the second NPN transistor defines an inverted terminal of the operational amplifier, a collector of the second NPN transistor defines an output terminal of the operational amplifier, emitters of the third and the fourth PNP transistors are connected to a power source, respectively, collectors of the third and the fourth PNP transistors are connected to collectors of the first and the second NPN transistors, respectively, bases of the third and the fourth PNP transistor is connected commonly, the common connecting point of the bases of the third and the fourth PNP transistors is connected to the collector of the third PNP transistor.

In the second level shift circuit of the present invention, said operational amplifier comprises first and second PNP transistors and third and fourth NPN transistors, a base of the first PNP transistor defines a non-inverted terminal of the operational amplifier, a base of the second PNP transistor defines an inverted terminal of the operational amplifier, a collector of the second PNP transistor defines an output terminal of the operational amplifier, emitters of the third and the fourth NPN transistors are connected to earth, respectively, collectors of the third and the fourth NPN transistors are connected to collectors of the first and the second PNP transistors, respectively, bases of the third and the fourth NPN transistor is connected commonly, the common connecting point of the bases of the third and the fourth NPN transistors is connected to the collector of the third NPN transistor.

In the first and the second level shift circuits of the present invention, said DC component extraction circuit comprises a low pass filter, a peak hold circuit or a sample hold circuit.

EMBODIMENT 1

Figure 1:
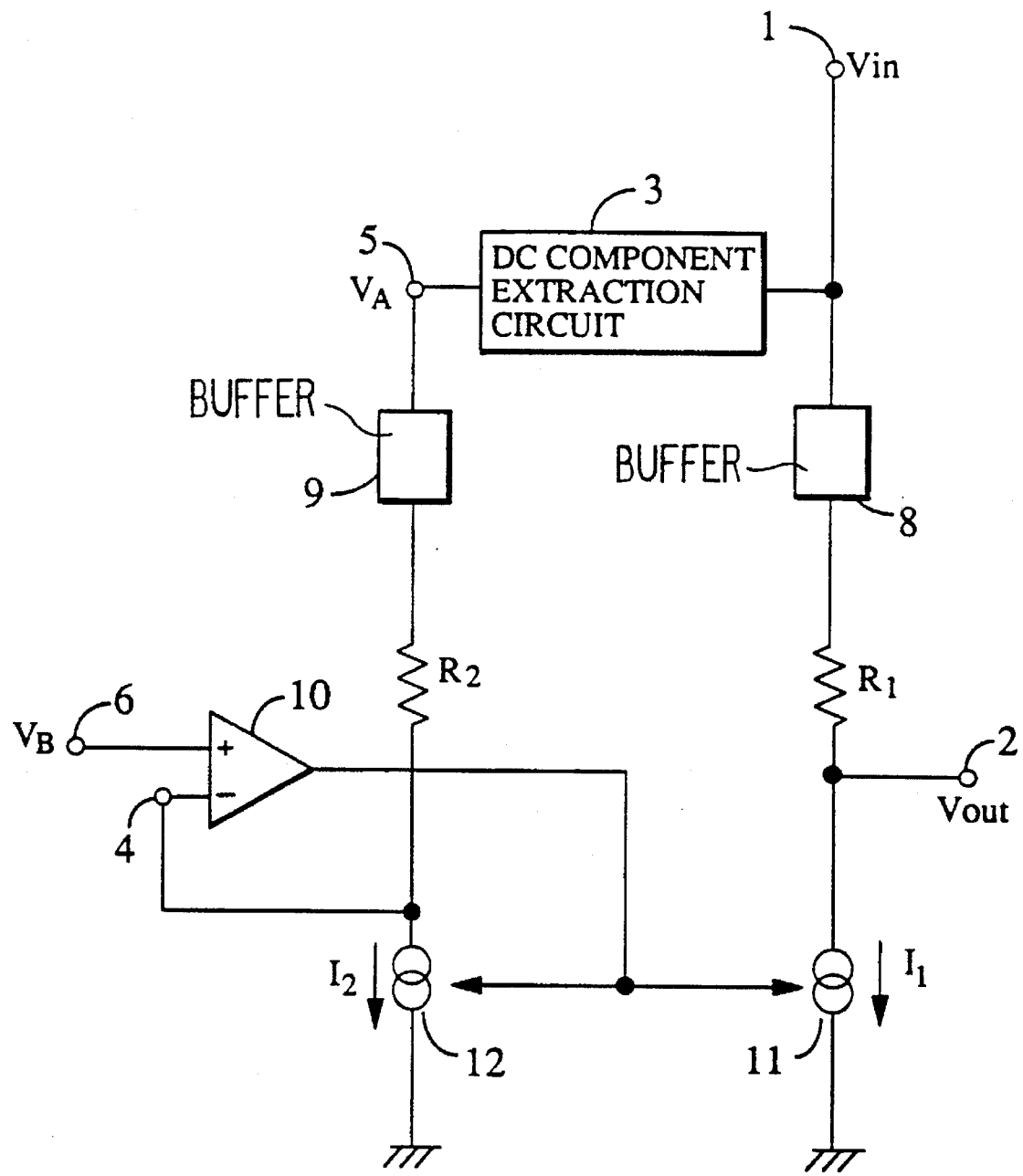
FIG. 1 is an embodiment of the present invention.

FIG. 1 shows an embodiment of the present invention. In FIG. 1, the numeral 1 denotes an input terminal, the numeral 2 denotes an output terminal, the numeral 3 denotes a DC component extraction circuit which extracts DC component of an input signal, the numeral 4 denotes an inverted terminal of an operational amplifier, the numeral 5 denotes an output of the DC component extraction circuit 3, the numeral 6 denotes a reference terminal which supplies reference voltage to the operational amplifier, the numerals 8 and 9 are buffers and the numeral 10 denotes the operational amplifier. $R_1$ and $R_2$ are resistors having equal resistance value, the numerals 11 and 12 ($I_1$, $I_2$) are constant current sources whose current are simultaneously controlled by the output from the amplifier 10. Current value of $I_1$ is the same as that of $I_2$. There are circuits such as a low pass filter, peak hold, sample hold which extract DC component of the input signal.

An operation of the embodiment is explained below. DC voltage $V_A$ of the input signal extracted by DC component extraction circuit 3 is applied to the extraction terminal 5 and the reference voltage $V_B$ is applied to the reference terminal 6. The reference voltage $V_B$ is selected so that a desired level shift quantity ($V_A-V_B$) is obtained. DC level $V_A$ is a DC component extracted from the input voltage. In case the level shift voltage is selected such that the output voltage is lower than the input voltage, the relation ($V_A > V_B$) is selected.

Voltage drop ($R_2 \times I_2$) is caused by the constant current $I_2$ in the resistor $R_2$ and the voltage ($V_A - R_2 \times I_2$) is applied to the inverted terminal 4 of the operational amplifier 10. The value of the constant current source $I_2$ is controlled by the output of the operational amplifier 10 and the control characteristic is set such that the current value of the constant current source $I_2$ decreases when the output voltage of the operational amplifier 10 rises.

If the constant current source $I_2$ is set as explained above, if the voltage $V_A$ of the extraction terminal is dropped from the state where the voltage of the inverted terminal 4 of the operational amplifier 10 and the voltage of the reference terminal 6 is balanced for some reason, for example, the voltage ($V_A - R_2 \times I_2$) at the inverted terminal 4 of the operational amplifier 10 becomes lower than the reference voltage $V_B$ which is applied to the reference terminal 6.

As a result, the output voltage of the operational amplifier 10 rises and the current value of the constant current source $I_2$ falls. Therefore, the voltage drop quantity of the resistor $R_2$ decreases and the voltage of the inverted input of the operational amplifier 10 rises. On the contrary, if the voltage VA of the extraction terminal rises from the state where the voltage of the inverted terminal 4 of the operational amplifier 10 and the voltage of the reference terminal 6 is balanced for some reason, the voltage ($V_A - R_2 \times I_2$) at the inverted terminal 4 of the operational amplifier 10 becomes higher than the reference voltage $V_B$ which is applied to the reference terminal 6. As a result, the output voltage of the operational amplifier 10 falls and the current value of the constant current source $I_2$ rises. Therefore, the voltage drop quantity of the resistor $R_2$ increases and the voltage of the inverted input of the operational amplifier 10 falls.

As mentioned above, even if the voltage of the inverted input of the operational amplifier 10 is different from that of the non-inverted input of the operational amplifier 10, the voltage difference between the two inputs finally becomes zero by the negative feedback operation. Accordingly, the voltages of the non-inverted input and the inverted input of the operational amplifier 10 are always kept equal and then ($V_B = V_A - R_2 \times I_2$) is obtained. In other words, the above equation can be rewritten such as ($V_A - V_B = R_2 \times I_2$), which means that the voltage drop ($R_2 \times I_2$) in resistor $R_2$ equals to the voltage difference ($V_A - V_B$) between the extraction terminal 5 and the reference terminal 6.

Figure 9:
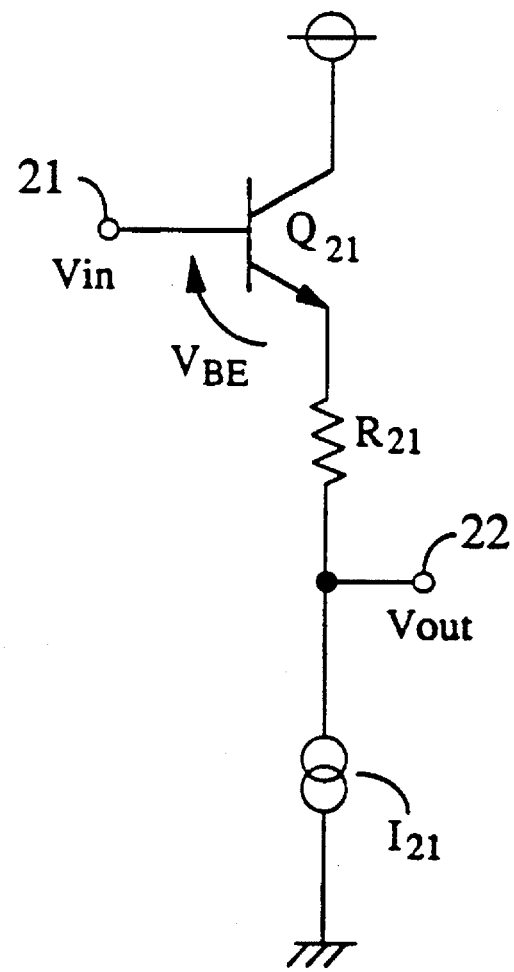
FIG. 9 is a circuit diagram of the conventional level shift circuit.
Figure 10:
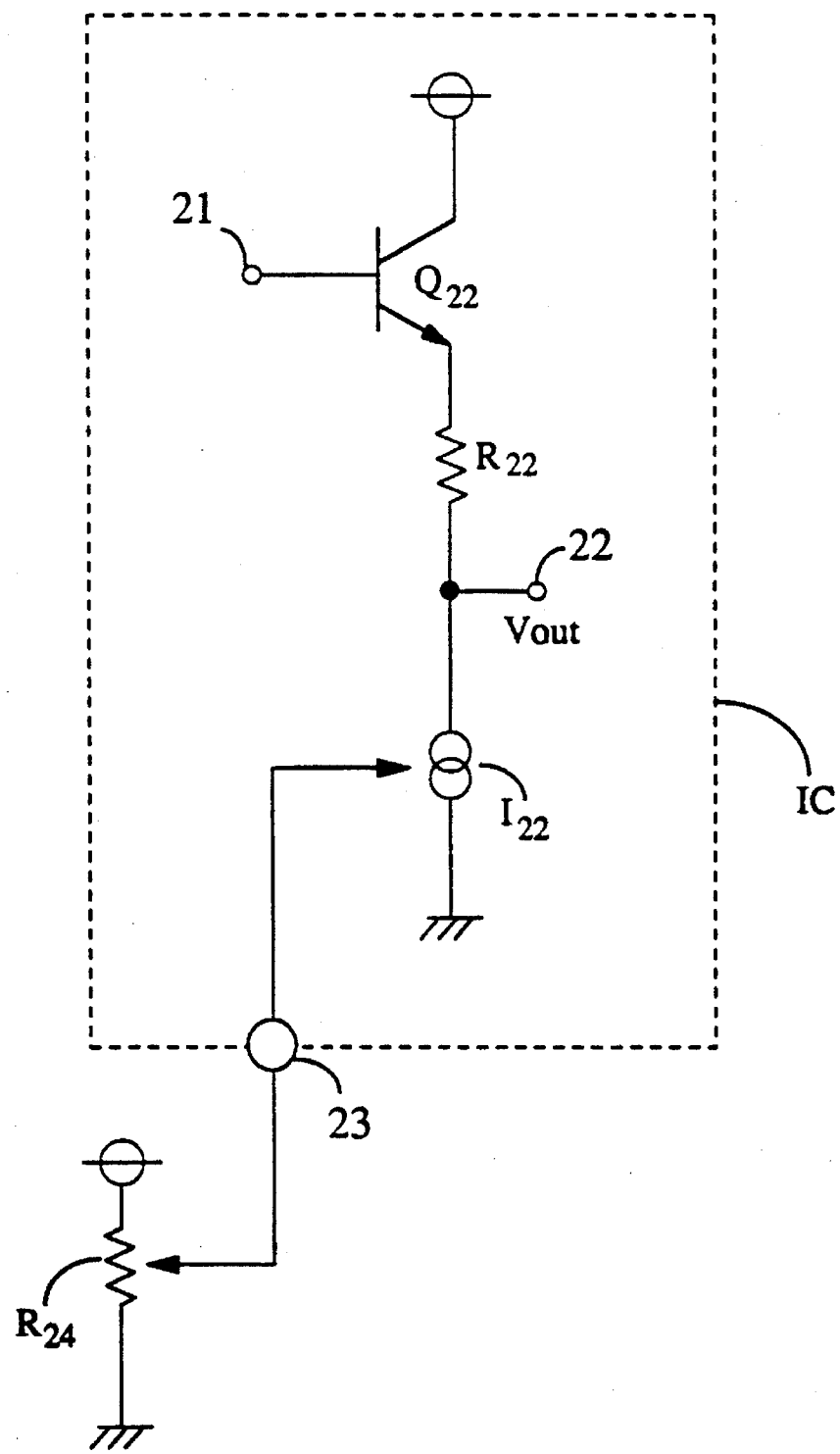
FIG. 10 is another circuit diagram of the conventional level shift circuit.
Figure 11:
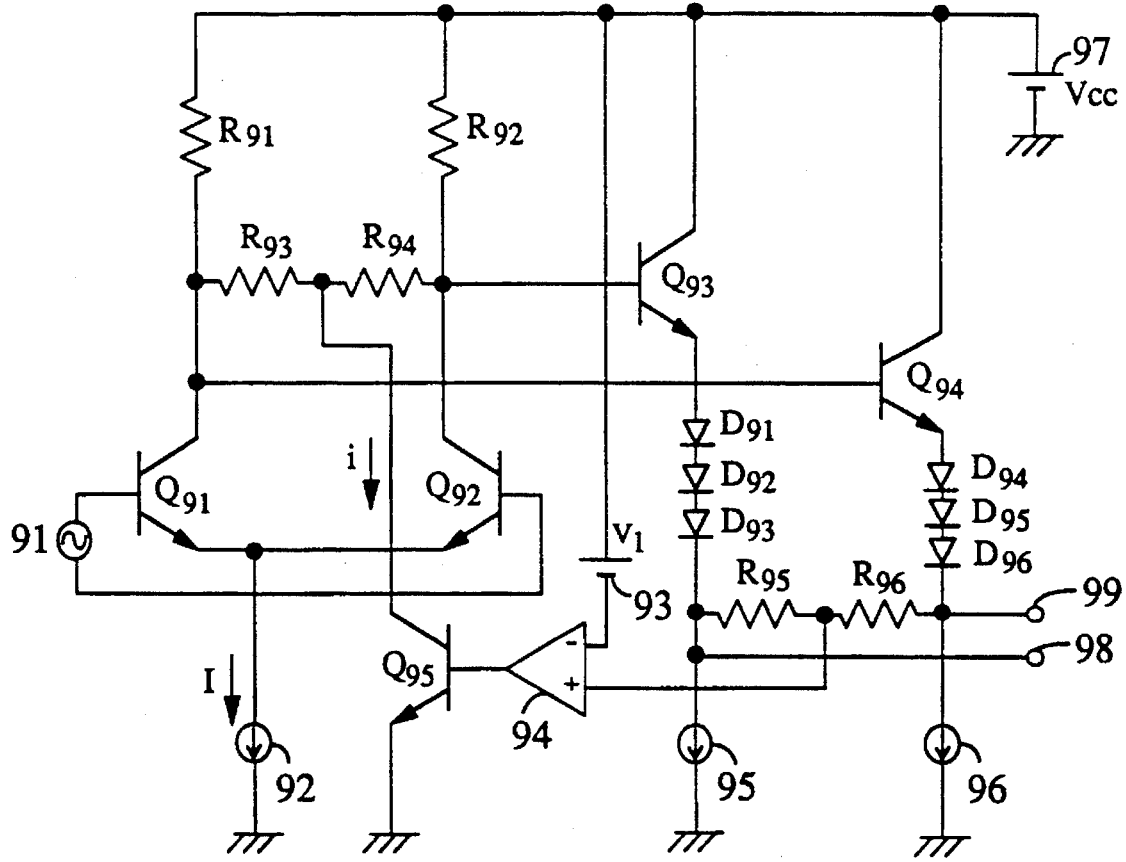
FIG. 11 is further other circuit diagram of the conventional level shift circuit.
Figure 12:
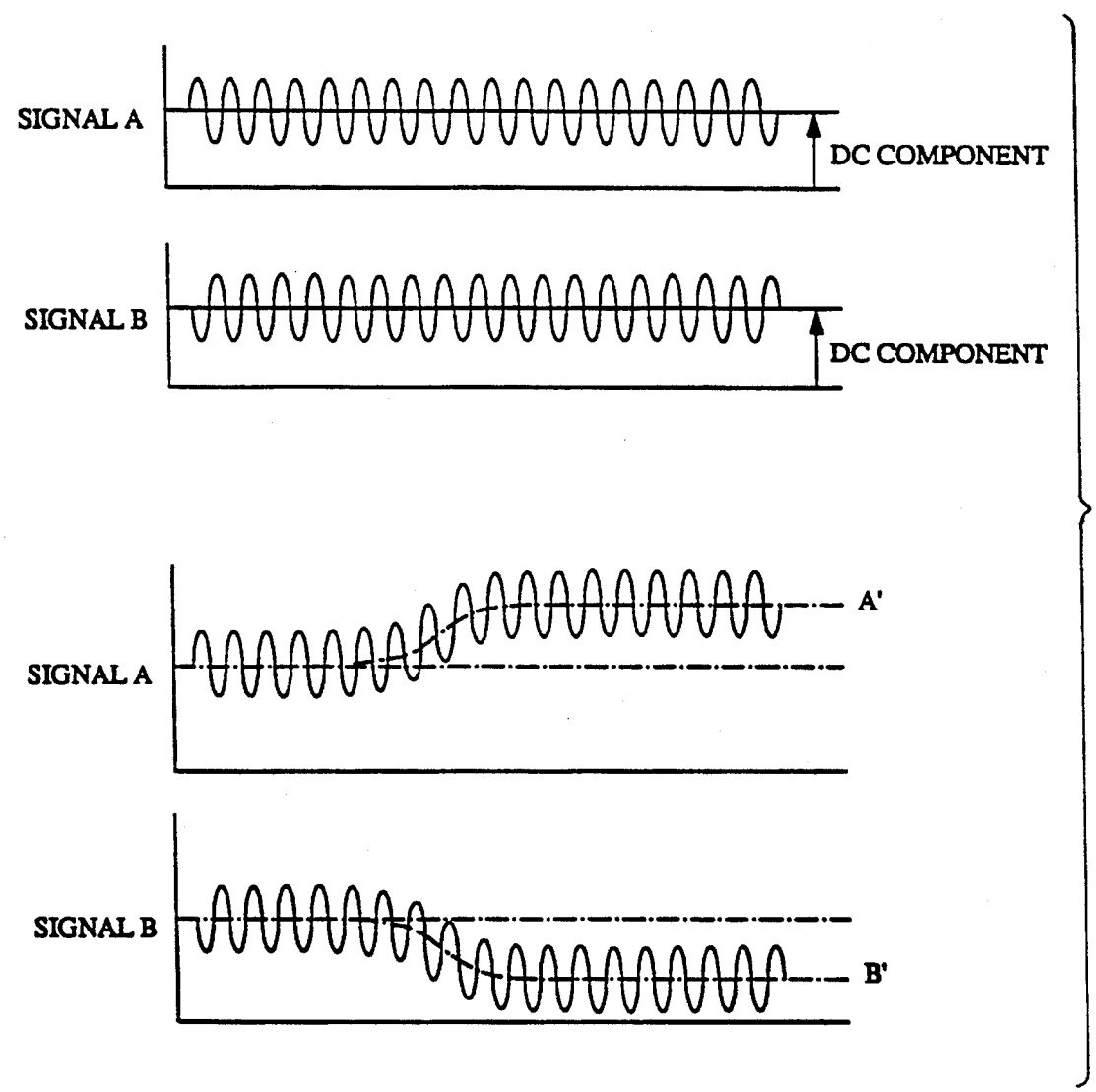
FIG. 12 illustrates a level variation of the input voltage in the conventional level shift circuit.

On the other hand, since the values of the resistor $R_1$ and the current $I_1$ are set to be equal with that of resistor $R_2$ and the current $I_2$, respectively, the voltage drop ($R_1 \times I_1$) in resistor $R_1$ becomes equal with the voltage drop ($R_2 \times I_2$) in resistor $R_2$. Accordingly, the output voltage $V_{out}$ of the output terminal 2 becomes a voltage which subtracts a difference voltage between the reference terminal 5 and the reference terminal 6 from the input signal $V_{in}$, that is, $V_{out}$ is indicated such as $V_{out} = V_{in} - (V_A - V_B)$. This circuit comprises a level shift circuit in which the level shift quantity from the input terminal 1 to the output terminal 2 is given by ($V_A - V_B$). Therefore, this circuit revises the drift component to keep the DC level of the output signal constant even if DC component of the input signal changes. In other words, since DC component of the input signal varies, the voltage applied to the extraction terminal 5 also varies, and the level shift quantity of the output signal varies for the same value. Accordingly, the DC component of the output signal compensates the DC component of the input signal and then it has always constant value. This circuit can of course operate in a similar manner as that of the conventional example shown in FIG. 9 by applying the fixed voltage to the extraction terminal 5 without using the DC component extraction circuit.

EMBODIMENT 2

Figure 2:
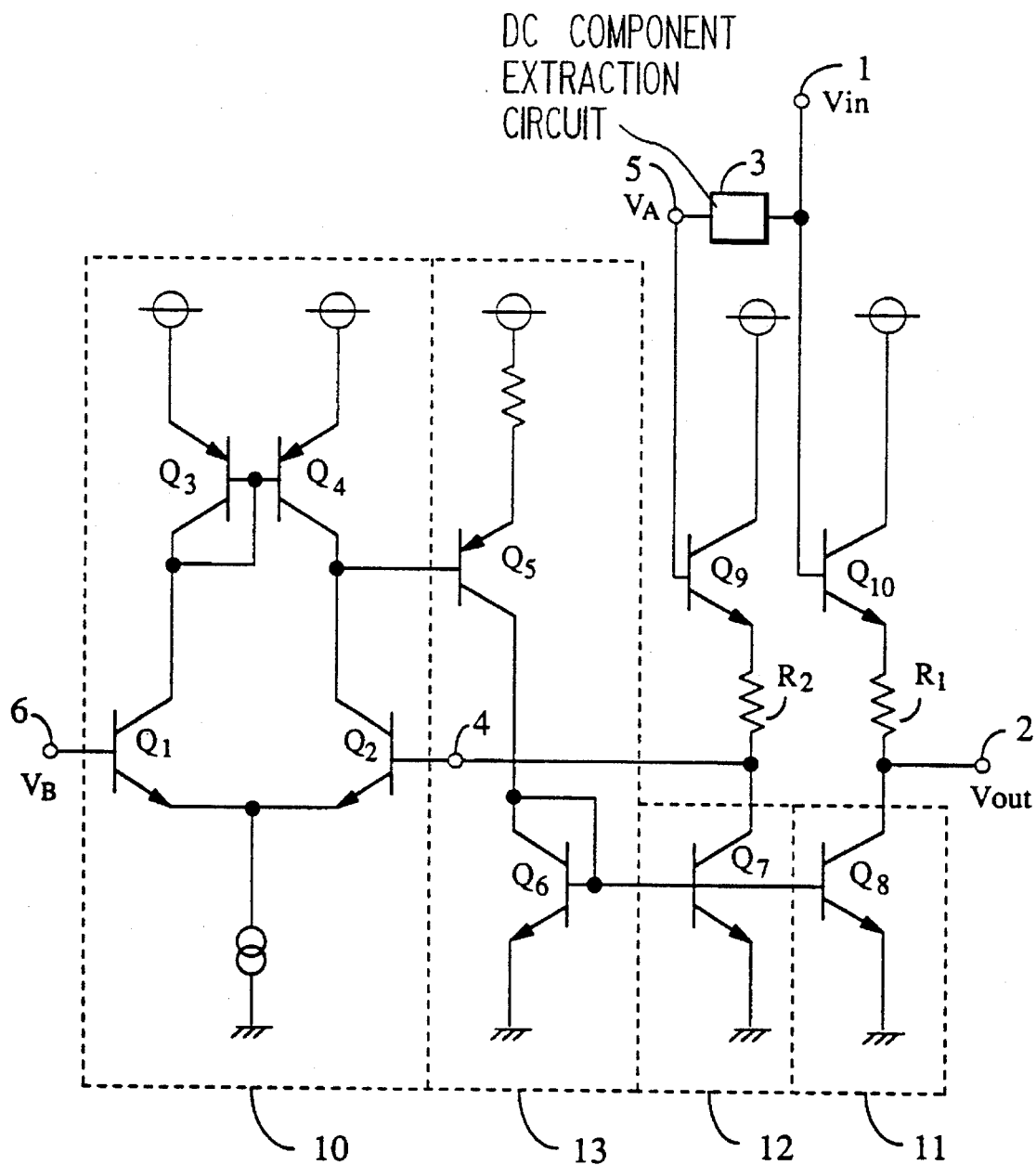
FIG. 2 is a detailed circuit diagram in which the buffer in FIG. 1 is consisted of NPN transistor.

FIG. 2 is a detailed concrete circuit diagram of a level shift circuit of the first embodiment of the FIG. 1, which is actually applied to the constitution of the semiconductor integrated circuit. In FIG. 2, the same numerals in FIG. 1 denote the same portions or the same elements. The numerals 11 and 12 denote constant current sources. They are equivalent to $I_1$ and $I_2$ in FIG. 1. The numeral 13 denotes an interface portion which controls the constant current sources 11 and 12. These constant current sources 11 and 12 operates to decrease the constant current values $I_1$ and $I_2$ when the output voltage of the operational amplifier 10 rises, as same as in the first embodiment. Transistors $Q_9$ and $Q_{10}$ operate as emitter followers. Transistors $Q_6$ and $Q_8$ constitute a mirror circuit between the transistor $Q_6$. This mirror circuit is designed so that the characteristics of the transistor $Q_7$ and the transistor $Q_8$ are the same.

An operation of the circuit in FIG. 2 is briefly explained below. In this circuit, an input signal $V_{in}$ is inputted into the terminal 1 and DC component extracted from the input signal is applied to the extraction terminal 5. A reference DC voltage is applied to the reference terminal 6. The DC voltage of the signal inputted from the terminal 1 fails by the base-emitter interval voltage ($V_{BE}$) of $Q_{10}$ and the voltage drop in the resistor $R_1$, and then is outputted from the terminal 2 as the output voltage $V_{out}$. The voltage inputted into the extraction terminal 5 falls by the base-emitter interval voltage ($V_{BE}$) of $Q_9$ and the voltage drop in the resistor $R_2$, and then is inputted into the inverted terminal 4 of the operational amplifier 10. In the operational amplifier 10, the base of $Q_1$ is a non-inverted input, the base of $Q_2$ is an inverted input and the base of $Q_5$ is output.

Now, it is assumed that DC voltage of the input signal of terminal 1 has risen. The voltage of the extraction terminal 5 then rises and so does the voltage of the inverted terminal 4 of the operational amplifier 10. Since the output voltage of the operational amplifier falls, the base voltage of $Q_5$ and the emitter voltage of $Q_5$ also fall. As a result, the current which flows through $Q_5$ increases and so do the collector currents of $Q_5$ and $Q_6$. Since transistors $Q_6$ and $Q_7$ comprise a current mirror circuit and the increase of the collector current of $Q_6$ makes the collector current of $Q_7$ increase as well. Accordingly, voltage drop in $R_2$ increases, and the inverted input voltage of the operational amplifier 10 falls. Since this circuit defines a negative feedback, the negative feedback operates so that the non-inverted input and the inverted input of the operational amplifier 10, that is, the base voltages of $Q_1$ and $Q_2$ finally become equal. On the other hand, $Q_6$ and $Q_8$ also constitute a current mirror circuit. By constituting the characteristics of $Q_7$ and $Q_8$ to be equal, the collector currents of $Q_7$ and $Q_8$ finally become equal (the collector currents of $Q_7$ and $Q_8$ needn't be equal with the collector current of $Q_6$). If the characteristics of $Q_9$ and $Q_{10}$ are equal and $R_1$ equals to $R_2$, the voltage drop from the terminal 1 to the terminal 2 is the same as the voltage drop from the extraction terminal 5 to the base of $Q_2$ which, in other words, is the voltage difference $(V_A-V_B)$ between the terminal 5 and the reference terminal 6.

Therefore, the voltage drop increases when DC voltage of the input signal rises, and the voltage drop decreases when DC voltage of the input signal falls, then the circuit operates so that the drift of DC voltage of input signal is canceled. Thus, the DC voltage of the output signal of the terminal 2 is kept constant.

Figure 3:
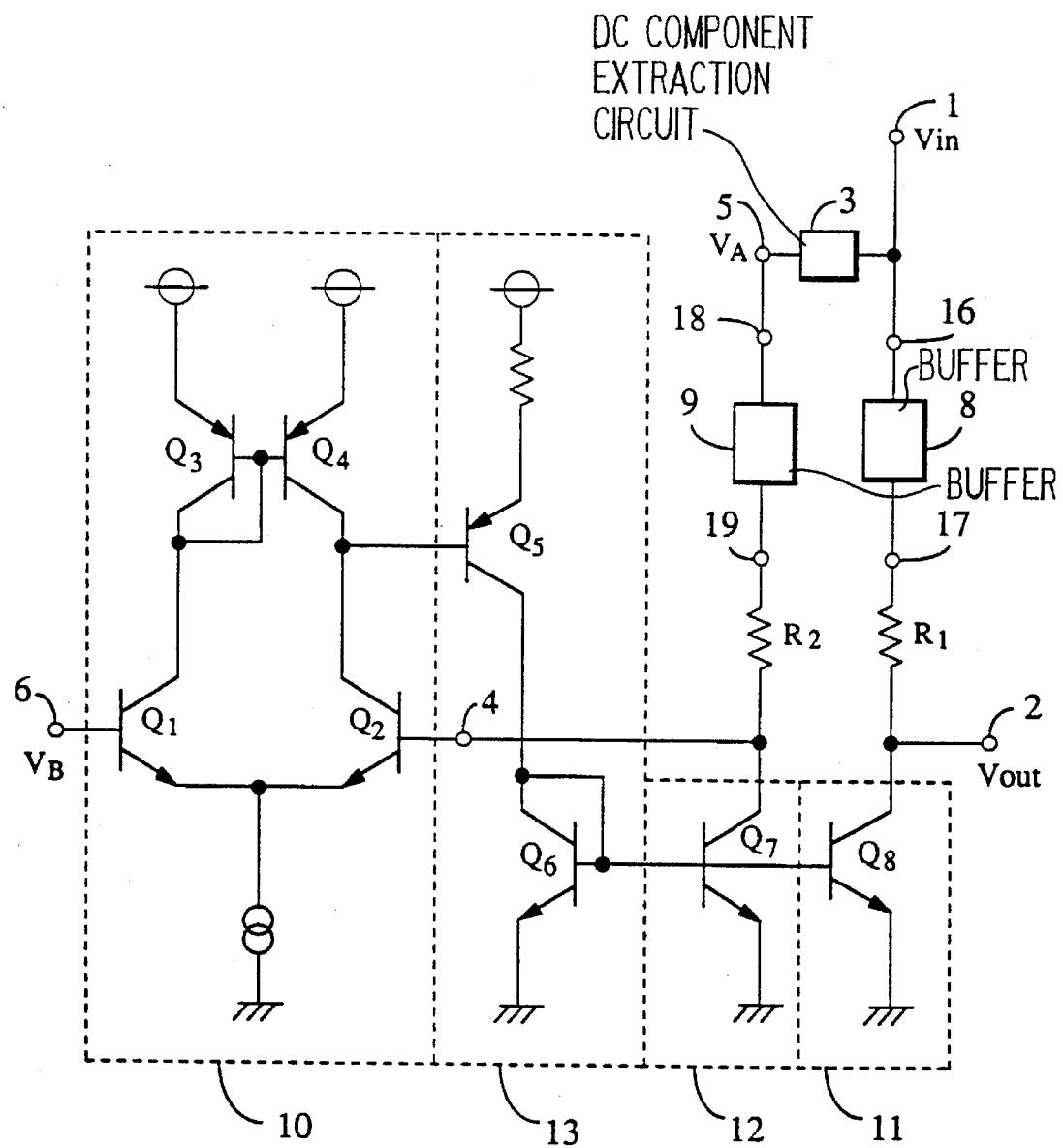
FIG. 3 is a detailed circuit diagram where there is no voltage drop in the buffer in FIG. 1.

In FIG. 2, by using the emitter follower type transistor such as $Q_9$ and $Q_{10}$, a buffer function is easily obtained which has a high input impedance and a low output impedance. However, since the base-emitter voltage of transistor is usually approximately 0.7 V, the output voltage is always lower than the input voltage by 0.7 V. Therefore, the level shift quantity lower than, for example, 0.3 V can not be obtained. Accordingly if the level shift lower than 0.7 V is needed, the circuit of FIG. 2 becomes inconvenient. In that case, it is necessary to use a buffer having no voltage difference between the input and output. FIG. 3 illustrates such an example.

EMBODIMENT 3

The level shift circuit of FIG. 3 is used when the level shift between the input and output smaller than 0.7 V is needed. In FIG. 3, the numerals 8 and 9 illustrate circuits which are used in place of the buffers shown in FIG. 1, in which the voltage difference between input and output is less than the base-emitter interval voltage of 0.7 V of a transistor. The remaining portions are exactly the same as those in FIG. 2.

Figure 4:
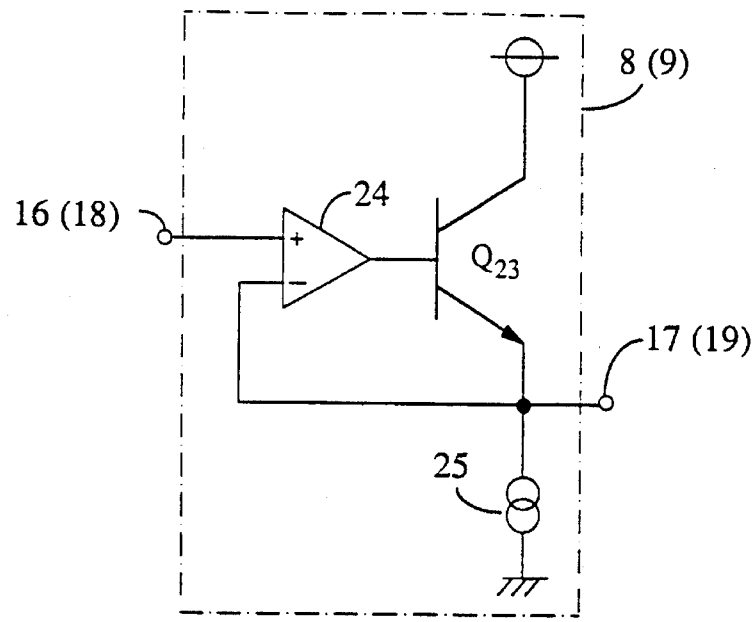
FIG. 4 is a detailed buffer circuit diagram in FIG. 3.

FIG. 4 shows an example of circuits of the buffers 8 and 9 of FIG. 3, in which the voltage difference between input and output is less than the base-emitter interval voltage of 0.7 V of a transistor. In the buffer of FIG. 4, an output of the operational amplifier 24 is connected to the base of NPN transistor $Q_{23}$. The emitter of the transistor $Q_{23}$ is connected to the constant current source 25 and the inverted terminal of the operational amplifier 24. Non-inverted terminal of the operational amplifier is used as an input terminal. Since this circuit operate to causes the voltage difference between the two inputs of the operational amplifier to be zero, the voltage difference between the input 16 and the output 17 also becomes zero. Since the emitter of NPN transistor is connected to the output terminal, its output impedance is low.

Figure 5:
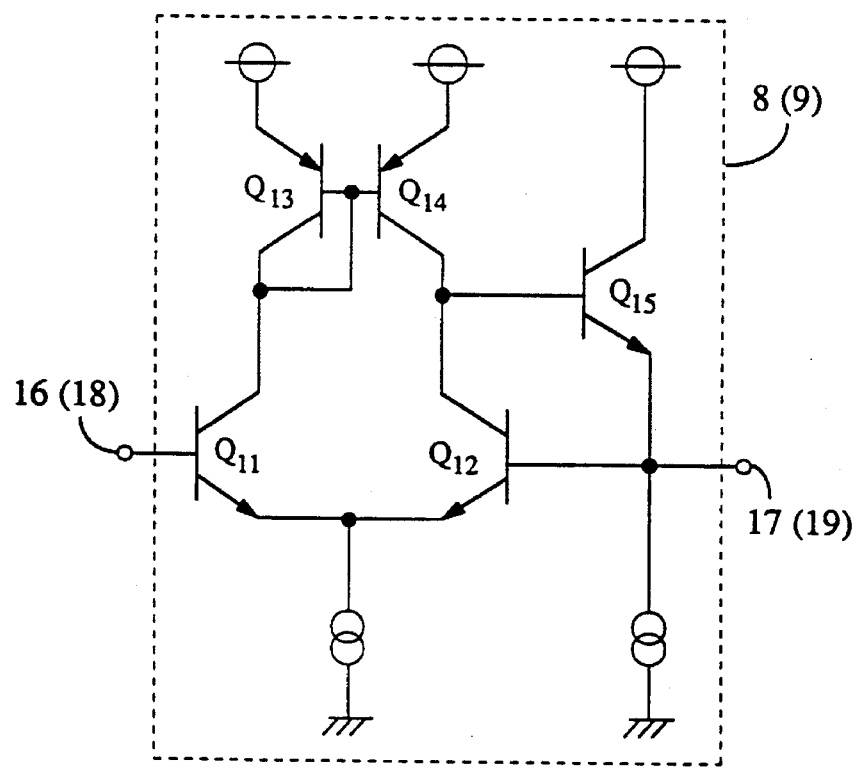
FIG. 5 is a further detailed buffer circuit diagram in FIG. 4.

As mentioned above, FIG. 4 illustrate buffers 8 and 9 functionally and roughly. On the other hand, FIG. 5 illustrate the buffers 8 and 9 concretely by the level of the integrated semiconductor circuit configuration. Input terminals 16 or 18 in FIGS. 4 and 5 are connected to the signal input terminal 1 and the output terminal (extraction terminal) 5 of DC component extraction circuit 3 in FIG. 3, respectively. Output terminals 17 or 19 are connected to the resistors $R_1$ and $R_2$ in FIG. 3, respectively. The voltage difference between the input terminal 16 and the output terminal 17 is so small that it can cope with the necessary level shift which is smaller than 0.7 V.

EMBODIMENT 4

Figure 6:
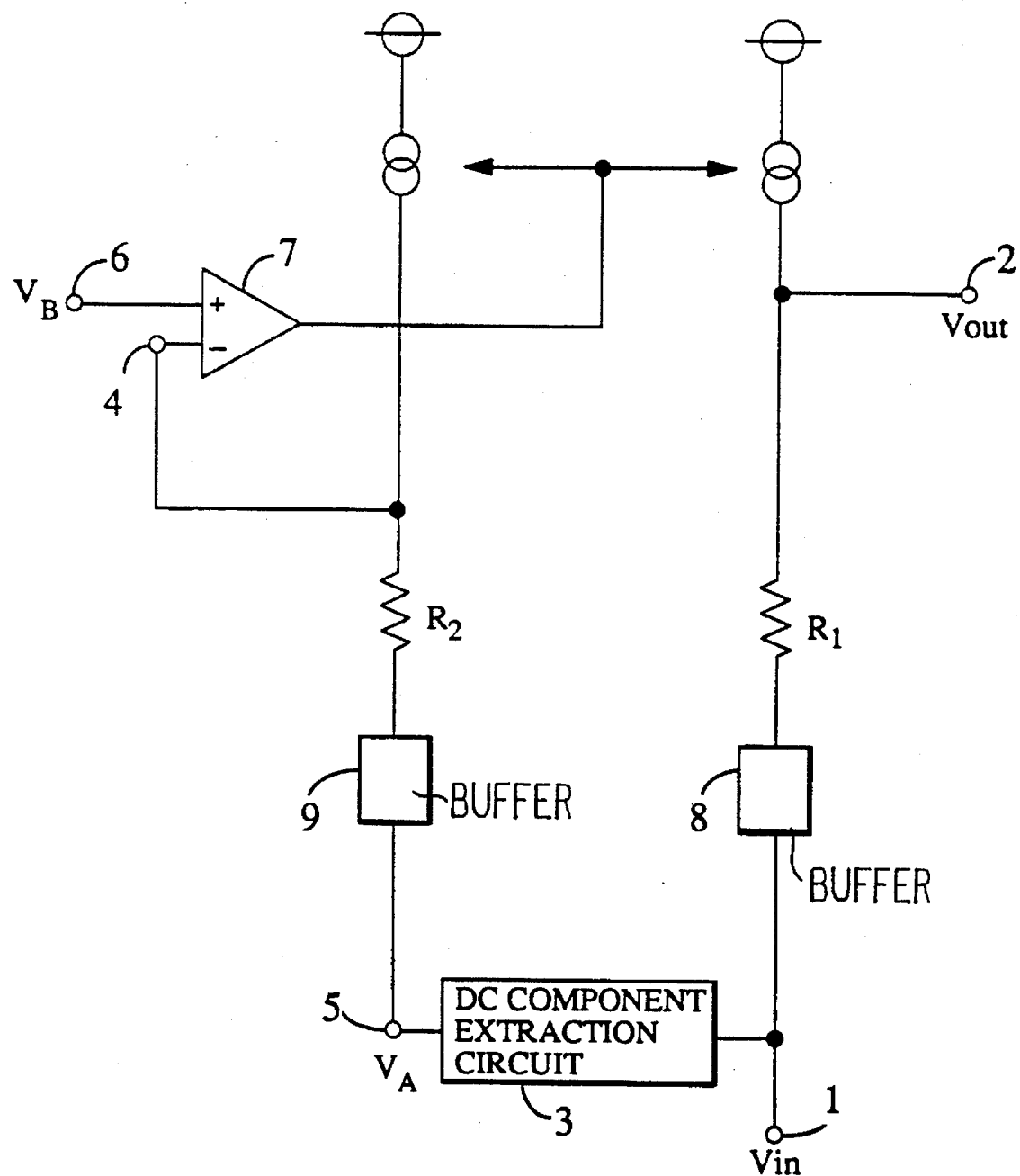
FIG. 6 is another embodiment of the present invention which is used when DC level of the output signal is higher than the input signal.
Figure 7:
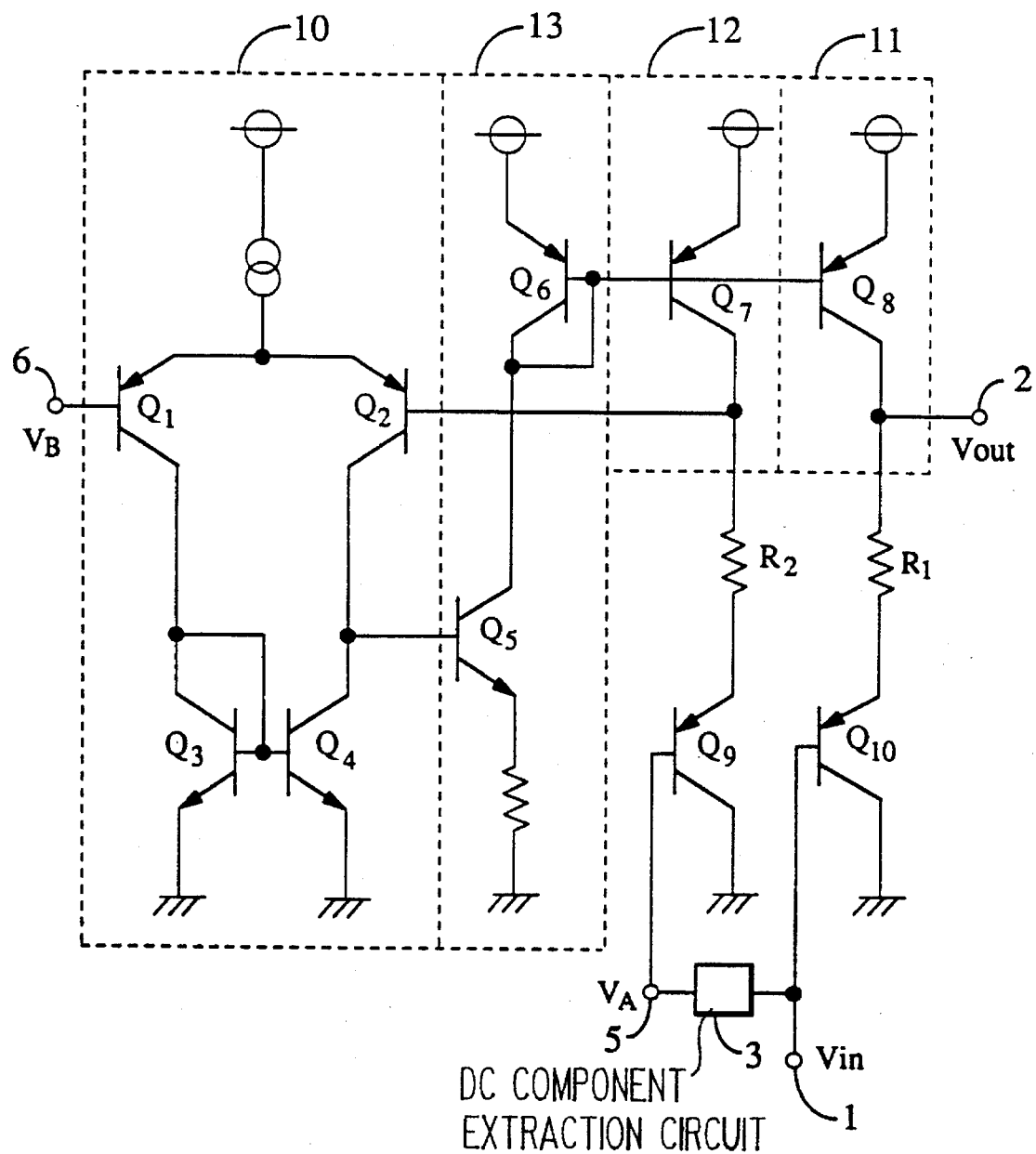
FIG. 7 is a detailed circuit diagram in which the buffer in FIG. 6 is consisted of PNP transistor.
Figure 8:
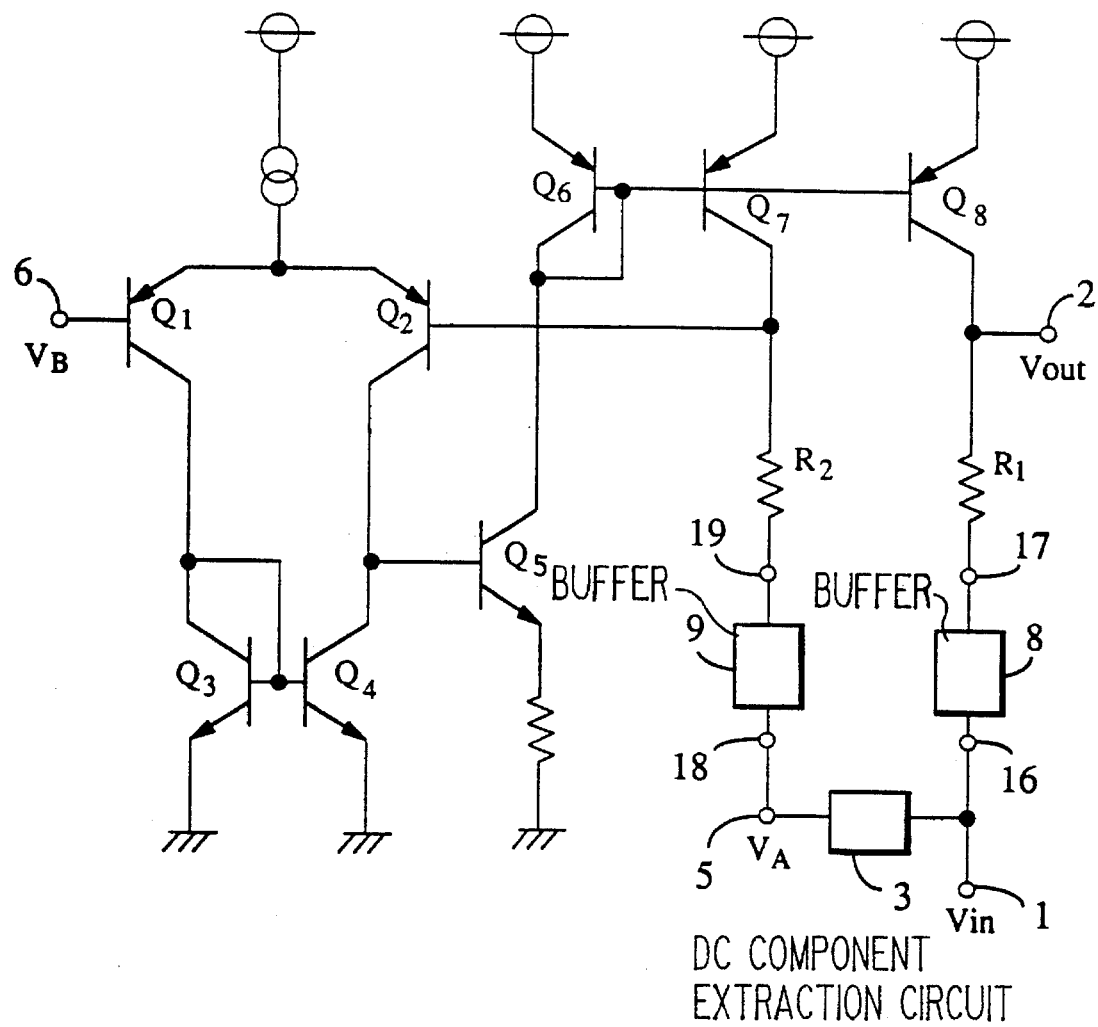
FIG. 8 is a detailed circuit diagram where there is no voltage drop in the buffer in FIG. 6.

In the third embodiment, a concrete level shift circuit is shown in which the electric potential of the output signal is lower than that of the input signal. On the contrary, if DC level of the output signal is needed to be set higher than DC level of the input signal, a level shift circuit such as FIGS. 6, 7 and 8 may be provided. In FIGS. 6, 7 and 8, the same numerals as that of FIGS. 1 to 3 denote the same portions or elements.

FIG. 6 is a circuit similar to FIG. 1. Only difference is in that whether current source is connected to the power source or the ground. In FIG. 1, the current source is connected to earth while the current source in FIG. 6 is connected to power source. The circuit constructed as shown in FIG. 6 is capable of obtaining an output voltage whose DC level is higher than that of the input signal.

FIG. 7 is a detailed concrete circuit diagram of a level shift circuit of the embodiment of the FIG. 6, which is actually applied to the constitution of the semiconductor integrated circuit. In FIG. 7, the same numerals in FIG. 6 denote the same portions or the same elements.

An operation of the circuits in FIG. 6 and FIG. 7 are briefly explained below. Since the basic operation is similar to that in FIG. 2, only different operation from FIG. 2 is explained. The input voltage having lower DC voltage is applied to the input terminal 1. Since the output terminal is taken out from the position which is close to the power source voltage, the input voltage and the alternating current magnitude are the same and then only DC level can be shifted up to near the power source voltage.

The level shift circuit of FIG. 8 is used when the level shift between the input and output smaller than 0.7 V is needed. In FIG. 8, the numerals 8 and 9 illustrate circuits which are used in place of the buffers shown in FIG. 6, in which the voltage difference between the input and the output is less than the base-emitter interval voltage of 0.7 V of a transistor. The remaining portions are exactly the same as those in FIG. 7.

The more concrete circuits of the buffers 8 and 9 in FIG. 8 are similar to the circuit explained in FIG. 5. The difference between FIG. 8 and FIG. 3 is in that the circuit in FIG. 3 is used where the output voltage is lower than the input voltage, while the circuit in FIG. 8 is used where the output voltage is higher than the input voltage.

As mentioned above, the input terminals 16 and 18 of the buffers 8, 9 in FIG. 5 are connected to the signal input terminal 1 in FIG. 8 or the extraction terminal 5 of DC component extraction circuit 3, respectively. The output terminals 17 and 19 are connected to the resistor $R_1$ and $R_2$ in FIG. 3, respectively. Since the voltage difference between the input terminal 16 and the output terminal 17 is very small, this circuit can cope with a circuit where the desired level shift is needed to be smaller than 0.7 V.

What is claimed is:

1. A level shift circuit comprising:

a first circuit comprising a first buffer, a first resistor connected to said first buffer, and a first constant current source connected to said first resistor;

a DC component extraction circuit connected to an input node of said first buffer;

a second circuit comprising a second buffer connected to said DC component extraction circuit, a second resistor connected to said second buffer, and a second constant current source connected to said second resistor; and an operational amplifier having an inverted node and a non-inverted node;

wherein an input signal of said level shift circuit is applied to said first circuit, a DC component voltage extracted from said input signal is applied to said second circuit, a voltage output from said second resistor is subtracted from said DC component voltage and is applied to said inverted node of the operational amplifier, and a reference voltage is applied to said non-inverted node of said operational amplifier, and wherein the first and second constant current sources are controlled by an output node of the operational amplifier.

2. A level shift circuit comprising:

a DC component extraction circuit, first and second buffers, first and second resistors, first and second constant current sources, and an operational amplifier; wherein an input node of said level shift circuit is connected to an input node of said first buffer, an output node of said first buffer is connected to one end of said first resistor, the other end of said first resistor is connected to one end of said first constant current source, the other end of said first constant current source is grounded, an output node of said level shift circuit is connected to the interconnection of said first resistor and said first constant current source, an input node of said DC component extraction circuit is connected to said input node and an output node of said DC component extraction circuit is connected to an input node of said second buffer, an output node of said second buffer is connected to one end of said second resistor, the other end of said second resistor is connected to one end of said second constant current source, the other end of said second constant current source is grounded, said other end of said second resistor is also connected to an inverted node of said operational amplifier, a reference node from which a reference voltage is applied is connected to a non-inverted node of said operational amplifier, an output of the operational amplifier is connected to control nodes of said first and second constant current sources so as to control constant current values of said first and second constant current sources.

3. A level shift circuit comprising:

a DC component extraction circuit, first and second buffers, first and second resistors, first and second constant current sources, an operational amplifier; wherein an input node which receives an input signal is connected to an input node of said first buffer, an output node of said first buffer is connected to one end of said first resistor, the other end of said first resistor is connected to one end of said first constant current source, the other end of said first constant current source is connected to a power source node, an output node of said level shift circuit is connected to the interconnection of said first resistor and said first constant current source, an input node of said DC component extraction circuit is connected to said input node and an output node of said DC component extraction circuit is connected to an input node of said second buffer, an output node of said second buffer is connected to one end of said second resistor, the other end of said second resistor is connected to one end of said second constant current source, the other end of said second constant current source is connected to said power source node, said other end of said second resistor is also connected to an inverted node of said operational amplifier, a reference node from which a reference voltage is applied is connected to a non-inverted node of said operational amplifier, an output node of said operational amplifier is connected to control nodes of said first and second constant current sources so as to control constant current values of said first and second constant current sources.

4. The level shift circuit according to claim 2, wherein said first and second buffers comprise transistors such that the input nodes of said first and second buffers are respectively connected to the base electrodes of corresponding transistors, the output nodes of said first and second buffers are respectively connected to emitter electrodes of said corresponding transistors, and a power source node is connected to collector electrodes of said corresponding transistors.

5. The level shift circuit according to claim 3, wherein said first and second buffers comprise transistors such that the input nodes of said first and second buffers are respectively connected to the base electrodes of corresponding transistors, the output nodes of said first and second buffers are respectively connected to emitter electrodes of said corresponding transistors, and the collector electrodes of said corresponding transistors are grounded.

6. The level shift circuit according to any of claims 1–3, wherein said first and second buffers comprise corresponding transistors such that the difference between the value of an input signal and the value of an output signal of said first and second buffers is smaller than the base-emitter voltage $V_{BE}$ of said corresponding transistors.

7. The level shift circuit according to claim 6, wherein each of said first and second buffers comprises;

an operation amplifier having a non-inverted terminal connected to the input node of said corresponding buffer, an inverted terminal connected to the output node of said corresponding buffer;

a transistor connected between a first power potential node and the output node of said corresponding buffer, the base electrode of said transistor connected to the output node of said operation amplifier; and a current source connected between the output node of said corresponding buffer and a second power potential node.

8. The level shift circuit according to claim 2, wherein said operation amplifier comprises first and second NPN transistors and first and second PNP transistors, a base electrode of said first NPN transistor defines a non-inverted node of said operational amplifier, a base electrode of said second NPN transistor defines an inverted of said operational amplifier, a collector electrode of said second NPN transistor defines an output node of said operational amplifier emitter electrodes of said first and second PNP transistors are connected to a power source node, collector electrodes of said first and second PNP transistors are connected to collector electrodes of said first and the second NPN transistors, respectively, base electrodes of said first and second PNP transistors are connected commonly, the common connecting point of said base electrodes of said first and second PNP transistors is connected to said collector electrode of said first PNP transistor.

9. The level shift circuit of claim 3, wherein said operational amplifier comprises first and second PNP transistors and first and second NPN transistors, a base electrode of said first PNP transistor defines a non-inverted node of said operational amplifier, a base electrode of said second PNP transistor defines an inverted node of said operational amplifier, a collector electrode of said second PNP transistor defines an output node of said operational amplifier, emitter electrodes of said first and second NPN transistors are connected to a ground node, collector electrodes of said first and second of NPN transistors are connected to collector electrodes of said first and second PNP transistors, respectively, base electrodes of said first and second NPN transistors are connected commonly, the common connecting point of said bases of said third and fourth NPN transistors is connected to said collector electrode of said first NPN transistor.

10. The level shift circuit according to any of claims 1–3, wherein said DC component extraction circuit comprises a low pass filter, a peak hold circuit, or a sample hold circuit.

11. A level shift circuit comprising:

a signal input node into which an input signal is inputted;

a signal output node for outputting an output signal which is generated by shifting a voltage level of said input signal;

a first buffer circuit whose input node connected to said signal input node;

a first resistor element connected between an output node of said first buffer circuit and said signal output node;

a first variable current source connected between said signal output node and a first power potential node, which having a control node;

a DC component extraction circuit whose input node is connected to said signal input node, whose output node outputs DC component voltage corresponding to the DC component voltage of said input signal inputted into said signal input node;

a second buffer circuit whose input node is connected to said output node of said DC component extraction circuit;

a second resistor element connected between the output node of said second buffer circuit and an interconnection node;

a second variable current source connected between said interconnection node and said first power potential node, which having a control node; and a first operation amplifier whose inverted node is connected to said interconnection node, whose non-inverted node is provided with a reference voltage, and whose output node is connected to both said control nodes of said first variable current source and said second variable current source.

12. The level shift circuit according to claim 11, wherein said first power potential node is grounded.

13. The level shift circuit according to claim 12, wherein said first buffer circuit comprises a first NPN transistor whose base electrode is connected to the input node of said first buffer circuit, whose emitter electrode is connected to the output node of said first buffer circuit, and whose collector electrode is connected to a second power potential node for which a positive potential is supplied; and said second buffer circuit comprises a second NPN transistor whose base electrode is connected to the input node of said second buffer circuit, whose emitter electrode is connected to the output node of said second buffer circuit, and whose collector electrode is connected to said second power potential node.

14. The level shift circuit according to claim 13, wherein said first variable current source comprises a third NPN transistor whose collector electrode is connected to said signal output node, whose emitter electrode is connected to said first power potential node, and whose base electrode connected to the control node of said first variable current source; and said second variable current source comprises a fourth NPN transistor whose collector electrode is connected to said interconnection node, whose emitter electrode is connected to said first power potential node, and whose base electrode is connected to the control node of said second variable current source.

15. The level shift circuit according to claim 14, wherein said first operation amplifier comprising an amplifier portion and an interface portion, wherein said amplifier portion comprises;

a fifth NPN transistor whose emitter electrode is connected to a common interconnection node and whose base electrode is connected to said non-inverted node;

a sixth NPN transistor whose emitter electrode is connected to said common interconnection node and whose base electrode is connected to said inverted node;

a first PNP transistor whose emitter electrode is connected to said second power potential node, and whose collector electrode and a base electrode are commonly connected to a collector electrode of said fifth NPN transistor;

a second PNP transistor whose emitter electrode is connected to said second power potential node, whose collector electrode is connected to a collector electrode of said sixth NPN transistor, and whose base electrode is connected to the base electrode of said first PNP transistor; and a current source connected between said common interconnection node and said first power potential node, and said interface portion comprises:

a third PNP transistor whose emitter electrode is coupled to said second power potential node and whose base electrode connected to the collector electrode of said sixth NPN transistor; and a seventh NPN transistor whose emitter electrode is connected to said first power potential node and whose collector electrode and base electrode are commonly connected to a collector electrode of said third PNP transistor and to said output node of said first operation amplifier.

16. The level shift circuit according to claim 12, wherein said first buffer circuit comprises:

a second operation amplifier whose non-inverted node is connected to the input node of said first buffer circuit and whose inverted node is connected to the output node of said first buffer circuit;

a first NPN transistor whose base electrode is connected to the output node of said second operation amplifier, whose emitter electrode is connected to the output node of said first buffer circuit, and whose collector electrode is connected to a second power potential node to which a positive potential is supplied; and a first current source connected between the output node of said first buffer circuit and said first power potential node, and said second buffer circuit comprises:

a third operation amplifier whose non-inverted node is connected to the input node of said second buffer circuit and whose inverted node is connected to the output node of said second buffer circuit;

a second NPN transistor whose base electrode is connected to the output node of said third operation amplifier, whose emitter electrode is connected to the output node of said second buffer circuit, and whose collector electrode is connected to a second power potential node to which a positive is supplied; and a second current source connected between the output node of said second buffer circuit and said first power potential node.

17. The level shift circuit according to claim 16, wherein said second operation amplifier comprises:

a third NPN transistor whose emitter electrode is connected to a first common interconnection node and whose base electrode is connected to the input node of said first buffer circuit;

a fourth NPN transistor whose emitter electrode is connected to said first common interconnection node and whose base electrode connected to the output node of said first buffer circuit;

a first PNP transistor whose emitter electrode is connected to said second power potential node and whose collector electrode and base electrode are commonly connected to the collector electrode of said third NPN transistor;

a second PNP transistor whose emitter electrode is connected to said second power potential node, whose collector electrode is connected to the collector electrode of said fourth NPN transistor, and whose base electrode is connected to the base electrode of said first PNP transistor; and a third current source connected between said first common interconnection node and said first power potential node, and said third operation amplifier comprises:

a fifth NPN transistor whose emitter electrode is connected to a second common interconnection node and whose base electrode connected to the input node of said second buffer circuit;

a sixth NPN transistor whose emitter electrode is connected to said second common interconnection node and whose base electrode connected to the output node of said second buffer circuit;

a third PNP transistor whose emitter electrode is connected to said second power potential node and whose collector electrode and base electrode are commonly connected to the collector electrode of said fifth NPN transistor;

a fourth PNP transistor whose emitter electrode is connected to said second power potential node, whose collector electrode is connected to the collector electrode of said sixth NPN transistor, and whose base electrode connected to the base electrode of said third PNP transistor; and a fourth current source connected between said second common interconnection node and said first power potential node.

18. The level shift circuit according to claim 12, wherein said first variable current source comprises a first NPN transistor whose collector electrode is connected to said signal output node, whose emitter electrode connected to said first power potential node, and whose base electrode is connected to the control node of said first variable current source and said second variable current source comprises a second NPN transistor whose collector electrode connected to said interconnection node, whose emitter electrode is connected to said first power potential node, and whose base electrode is connected to the control node of said second variable current source.

19. The level shift circuit according to claim 18, wherein said first operation amplifier comprising an amplifier portion and an interface portion; wherein said amplifier portion comprises:

a third NPN transistor whose emitter electrode is connected to a common interconnection node and whose base electrode connected to said non-inverted node;

a fourth NPN transistor whose emitter electrode is connected to said common interconnection node and whose base electrode connected to said inverted node;

a first PNP transistor whose emitter electrode is connected to said second power potential node and whose collector electrode and base electrode are commonly connected to the collector electrode of said third NPN transistor;

a second PNP transistor whose emitter electrode is connected to said second power potential node, whose collector electrode is connected to the collector electrode to said fourth NPN transistor, and whose base electrode is connected to the base electrode of said first PNP transistor; and a third current source connected between said common interconnection node and said first power potential node, and said interface portion comprises:

a third PNP transistor whose emitter electrode is connected to said second power potential node and whose base electrode is connected to the collector electrode of said fourth NPN transistor; and a fifth NPN transistor whose emitter electrode is connected to said first power potential node and whose collector electrode and base electrode are commonly connected to the collector electrode of said third PNP transistor and the output node of said first operation amplifier.

20. The level shift circuit according to claim 11, wherein said first power potential node is supplied by positive potential.

21. The level shift circuit according to claim 20, wherein said first buffer circuit comprises a first PNP transistor whose base electrode is connected to the input node of said first buffer circuit, whose emitter electrode is connected to the output node of said first buffer circuit, and whose collector electrode is connected to a second power potential node where ground potential is provided, and said second buffer circuit comprises a second PNP transistor whose base electrode is connected to the input node of said second buffer circuit, whose emitter electrode is connected to the output node of said second buffer circuit, and whose collector electrode is connected to said second power potential node.

22. The level shift circuit according to claim 21, wherein said first variable current source comprises a third PNP transistor whose collector electrode is connected to said signal output node, whose emitter electrode is connected to said first power potential node, and whose base electrode is connected to the control node of said first variable current source, and said second variable current source comprises a fourth PNP transistor whose collector electrode is connected to said interconnection node, whose emitter electrode is connected to said first power potential node, and whose base electrode is connected to the control node of said second variable current source.

23. The level shift circuit according to claim 22, wherein said first operation amplifier comprising an amplifier portion and an interface portion, wherein said amplifier portion comprises:

a fifth PNP transistor whose emitter electrode is connected to a common interconnection node and whose base electrode is connected to said non-inverted node;

a sixth PNP transistor whose emitter electrode is connected to said common interconnection node and whose base electrode is connected to said inverted node;

a first NPN transistor whose emitter electrode is connected to said second power potential node and whose collector electrode and base electrode are commonly connected to the collector electrode of said fifth PNP transistor;

a second NPN transistor whose emitter electrode is connected to said second power potential node, whose collector electrode is connected to the collector electrode of said sixth PNP transistor, and whose base electrode is connected to the base electrode of said first NPN transistor; and a current source connected between said common interconnection node and said first power potential node, and said interface portion comprises:

a third NPN transistor whose emitter electrode is connected to said second power potential node and whose base electrode is connected to the collector electrode of said sixth PNP transistor; and a seventh PNP transistor whose emitter electrode is connected to said first power potential node and whose collector electrode and base electrode are commonly connected to the collector electrode of said third NPN transistor and the output node of said first operation amplifier.

24. The level shift circuit according to claim 20, wherein said first buffer circuit comprises:

a second operation amplifier whose non-inverted node is connected to the input node of said first buffer circuit and whose inverted node is connected to the output node of said first buffer circuit;

a first NPN transistor whose base electrode is connected to the output node of said second operation amplifier, whose emitter electrode is connected to the output node of said first buffer circuit, and whose collector electrode is connected to a second power potential node to which a positive potential is supplied; and a first current source connected between the output node of said first buffer circuit and said first power potential node, and said second buffer circuit comprises:

a third operation amplifier whose non-inverted node is connected to the input node of said second buffer circuit and whose inverted node is connected to the output node of said second buffer circuit;

a second NPN transistor whose base electrode is connected to the output node of said third operation amplifier, whose emitter electrode is connected to the output node of said second buffer circuit, and whose collector electrode is connected to a second power potential node to which a positive potential is supplied; and a second current source connected between the output node of said second buffer circuit and said first power potential node.

25. The level shift circuit according to claim 24, wherein said second operation amplifier comprises:

a third NPN transistor whose emitter electrode is connected to a first common interconnection node and whose base electrode is connected to the input node of said first buffer circuit;

a fourth NPN transistor whose emitter electrode is connected to said first common interconnection node and whose base electrode connected to the output node of said first buffer circuit;

a first PNP transistor whose emitter electrode is connected to said second power potential node and whose collector electrode and base electrode are commonly connected to the collector electrode of said third NPN transistor;

a second PNP transistor whose emitter electrode is connected to said second power potential node, whose collector electrode is connected to the collector electrode of said fourth NPN transistor, and whose base electrode is connected to the base electrode of said first PNP transistor; and a third current source connected between said first common interconnection node and said first power potential node, and said third operation amplifier comprises:

a fifth NPN transistor whose emitter electrode is connected to a second common interconnection node and whose base electrode connected to the input node of said second buffer circuit;

a sixth NPN transistor whose emitter electrode is connected to said second common interconnection node and whose base electrode connected to the output node of said second buffer circuit;

a third PNP transistor whose emitter electrode is connected to said second power potential node and whose collector electrode and base electrode are commonly connected to the collector electrode of said fifth NPN transistor;

a fourth PNP transistor whose emitter electrode is connected to said second power potential node, whose collector electrode is connected to the collector electrode of said sixth NPN transistor, and whose base electrode connected to the base electrode of said third PNP transistor; and a fourth current source connected between said second common interconnection node and said first power potential node.

26. The level shift circuit according to claim 20, wherein said first variable current source comprises a first PNP transistor whose collector electrode is connected to said signal output node, whose emitter electrode connected to said first power potential node, and whose base electrode is connected to the control node of said first variable current source, and said second variable current source comprises a second PNP transistor whose collector electrode connected to said interconnection node, whose emitter electrode is connected to said first power potential node, and whose base electrode is connected to the control node of said second variable current source.

27. The level shift circuit according to claim 26, wherein said first operation amplifier comprising an amplifier portion and an interface portion, an amplifier portion comprises;

a third PNP transistor whose emitter electrode is connected to a common interconnection node and whose base electrode connected to said non-inverted node;

a fourth PNP transistor whose emitter electrode is connected to said common interconnection node and whose base electrode connected to said inverted node;

a first NPN transistor whose emitter electrode is connected to said second power potential node and whose collector electrode and base electrode are commonly connected to the collector electrode of said third PNP transistor;

a second NPN transistor whose emitter electrode is connected to said second power potential node, whose collector electrode is connected to the collector electrode of said fourth PNP transistor, and whose base electrode is connected to the base electrode of said first NPN transistor; and a third current source connected between said common interconnection node and said first power potential node, and said interface portion comprises:

a third NPN transistor whose emitter electrode is connected to said second power potential node and whose base electrode is connected to the collector electrode of said fourth PNP transistor; and a fifth PNP transistor whose emitter electrode is connected to said first power potential node and whose collector electrode and base electrode are commonly connected to the collector electrode of said third NPN transistor and the output node of said first operation amplifier.

* * * * *